(12) United States Patent
Kavalipurapu et al.

(10) Patent No.: US 8,891,297 B2
(45) Date of Patent: Nov. 18, 2014

(54) MEMORY CELL SENSING

(75) Inventors: Kalyan C. Kavalipurapu, Santa Clara, CA (US); Jae-Kwan Park, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 458 days.

(21) Appl. No.: 13/286,301

(22) Filed: Nov. 1, 2011

(65) Prior Publication Data

US 2013/0107623 A1   May 2, 2013

(51) Int. Cl.
G11C 7/00 (2006.01)
G11C 16/28 (2006.01)
G11C 16/04 (2006.01)

(52) U.S. Cl.
CPC .......... G11C 16/0483 (2013.01); G11C 16/28 (2013.01)
USPC .............. 365/185.03; 365/185.18; 365/185.2

(58) Field of Classification Search
CPC .... G11C 16/04; G11C 11/4091; G11C 16/28; G11C 29/34; G11C 16/26; G11C 16/3418; G11C 7/10; G11C 7/109
USPC .............. 365/185.2, 185.03, 185.18, 185.17, 365/185.24, 185.21
See application file for complete search history.

(56) References Cited

U.S. PATENT DOCUMENTS

| | | | |
|---|---|---|---|
| 5,867,429 A | 2/1999 | Chen et al. | |
| 6,956,770 B2 | 10/2005 | Khalid et al. | |
| 6,987,693 B2 | 1/2006 | Cernea et al. | |
| 7,020,017 B2 | 3/2006 | Chen et al. | |
| 7,187,585 B2 | 3/2007 | Li et al. | |
| 7,196,928 B2 | 3/2007 | Chen | |
| 7,400,532 B2 | 7/2008 | Aritome | |
| 7,898,864 B2 | 3/2011 | Dong | |
| 2002/0194425 A1* | 12/2002 | Penchuk | 711/105 |
| 2004/0105314 A1 | 6/2004 | Shibata et al. | |
| 2007/0183204 A1 | 8/2007 | Kim | |
| 2008/0019175 A1 | 1/2008 | Li et al. | |
| 2008/0285341 A1* | 11/2008 | Moschiano et al. | 365/185.02 |
| 2010/0074026 A1 | 3/2010 | Kang | |
| 2010/0091582 A1 | 4/2010 | Vali et al. | |
| 2011/0051523 A1 | 3/2011 | Manabe et al. | |
| 2011/0063919 A1 | 3/2011 | Chandrasekhar et al. | |
| 2011/0122695 A1 | 5/2011 | Li et al. | |
| 2011/0122702 A1 | 5/2011 | Li | |
| 2013/0070524 A1* | 3/2013 | Dutta et al. | 365/185.03 |

OTHER PUBLICATIONS

International Search Report and Written Opinion for related PCT Application No. PCT/2012/061338, dated Mar. 29, 2013, 11 pages.

* cited by examiner

*Primary Examiner* — Hien Nguyen
(74) *Attorney, Agent, or Firm* — Brook, Cameron & Huebsch, PLLC

(57) ABSTRACT

This disclosure concerns memory cell sensing. One or more methods include determining a data state of a first cell coupled to a first data line in response to a request to sense a data state of a second cell coupled to a second data line, applying a reference voltage to the first data line, floating the second data line while adjusting a voltage of the first data line to an adjusted voltage associated with the determined data state of the first cell, determining an effect on the second data line due, at least in part, to the adjusting the voltage of the first data line, and sensing the data state of the second cell by applying a particular sensing voltage to a selected access line to which the first cell and the second cell are coupled, the particular sensing voltage based on the determined effect on the second data line.

37 Claims, 6 Drawing Sheets

| 1ST SENSE | 2ND SENSE | RESULT |
|-----------|-----------|--------|
| FAIL | PASS | SV_1 |
| FAIL | FAIL | SV_2 |
| PASS | X | SV_0 |

MEMORY CELL SENSING

TECHNICAL FIELD

The present disclosure relates generally to semiconductor memory apparatuses and methods, and more particularly, to memory cell sensing.

BACKGROUND

Memory devices are typically provided as internal, semiconductor, integrated circuits in computers or other electronic apparatuses. There are many different types of memory, including random-access memory (RAM), read only memory (ROM), dynamic random access memory (DRAM), synchronous dynamic random access memory (SDRAM), resistive random access memory (RRAM), phase change random access memory (PCRAM), magnetic random access memory (MRAM), and flash memory, among others.

Uses for flash memory include memory for solid state drives (SSDs), personal computers, personal digital assistants (PDAs), digital cameras, cellular telephones, portable music players (e.g., MP3 players), and movie players, among various other electronic apparatuses. Flash memory cells can be organized in an array architecture (e.g., a NAND or NOR architecture) and can be programmed to a target (e.g., desired) data state. For instance, electric charge can be placed on or removed from a charge storage structure (e.g., a floating gate or a charge trap) of a memory cell to program the cell into one of two data states, such as to represent one of two binary digits (e.g., 1 or 0).

Flash memory cells can also be programmed to one of more than two data states, such as to represent one of, for example, 1111, 0111, 0011, 1011, 1001, 0001, 0101, 1101, 1100, 0100, 0000, 1000, 1010, 0010, 0110, and 1110. Such cells may be referred to as multi state memory cells, multiunit cells, or multilevel cells (MLCs). MLCs can allow the manufacture of higher density memories without increasing the number of memory cells since each cell can represent more than one digit (e.g., more than one bit). One of the data states can be an erased state. For example, a "lowermost" data state may not be programmed above the erased state. That is, if the cell is programmed to the lowermost data state, it remains in the erased state rather than having additional charge added to the charge storage structure of the cell during a programming operation. Data states other than the erased state can be referred to as "non-erased" states.

The programmed charge stored on charge storage structures (e.g., floating gates) of flash memory cells can shift due to coupling between charge storage structures of adjacent (e.g., neighboring) cells (e.g., cells coupled to adjacent data lines, which may be referred to as bit lines). For example, in instances in which a particular floating gate memory cell is programmed prior to one or both of the floating gate memory cells on neighboring bit lines, the subsequent programming of the cells on the neighboring bit lines can shift the threshold voltage (Vt) of a the particular cell due to such floating gate-to-floating gate (FG-FG) coupling. Such Vt shifts can affect the determined data state of the particular cell responsive to a sensing (e.g., read) operation and, in some cases, can lead to erroneous sensing of the data (e.g., a determined data state that is erroneous). Some programming techniques, such as shielded bit line (SBL) programming, can be used to reduce effects of FG-FG coupling. However, as the spacing between adjacent bit lines and access lines (e.g., word lines) is reduced, the effects of FG-FG coupling between adjacent cells, as well as the effects of capacitive coupling between the adjacent bit lines and word lines themselves, can increase.

DETAILED DESCRIPTION

Figure 1:
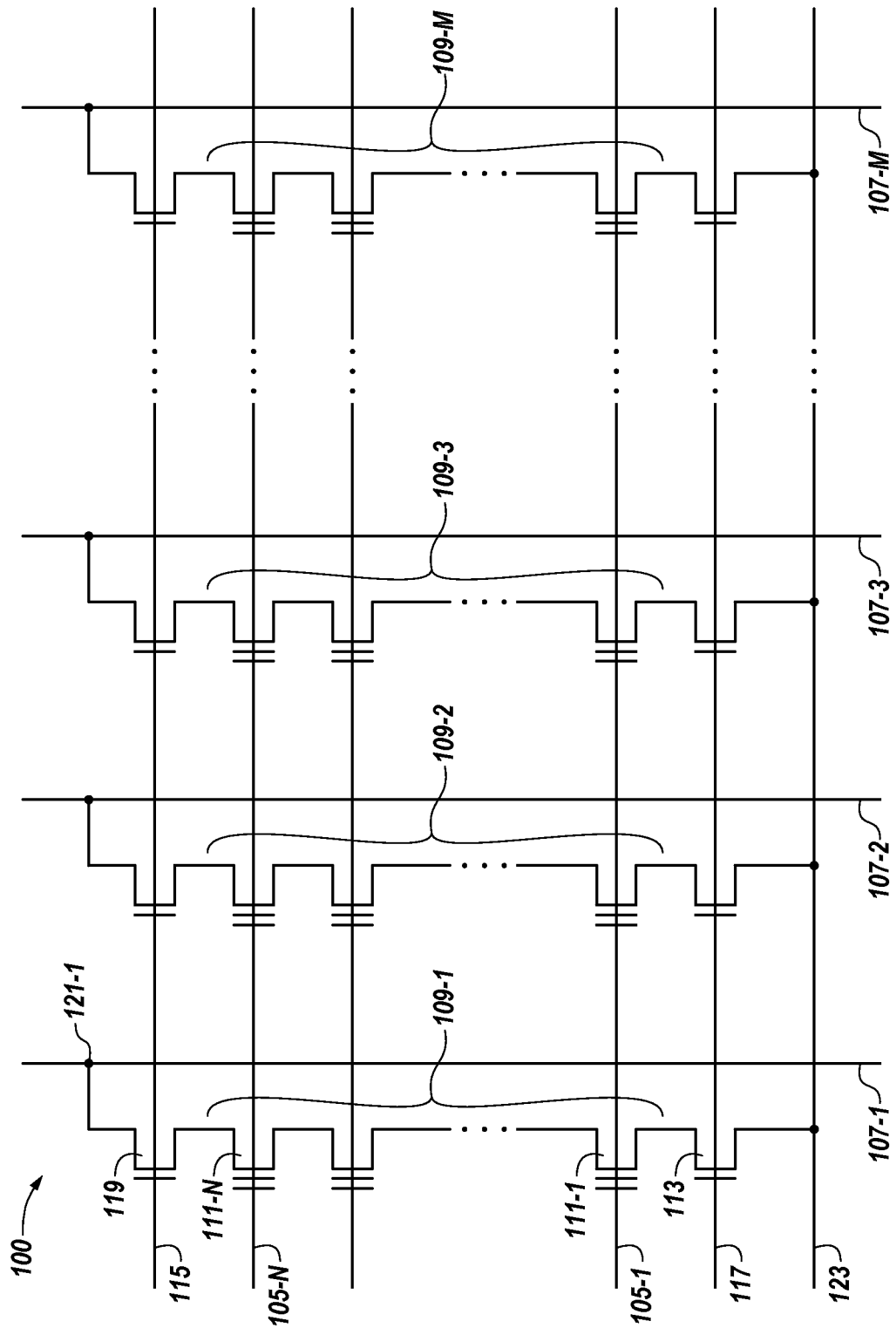
FIG. 1 is a schematic of a portion of a non-volatile memory array in accordance with a number of embodiments of the present disclosure.

The present disclosure includes apparatuses and methods for sensing memory cells. For example, sensing memory cells can include determining a data state of a first memory cell coupled to a first data line in response to a request to sense a data state of a second memory cell coupled to a second data line adjacent the first data line, applying a reference voltage to the first data line, floating the second data line while adjusting a voltage of the first data line from the reference voltage to an adjusted voltage associated with the determined data state of the first memory cell, determining an effect on the second data line due, at least in part, to the adjusting the voltage of the first data line, and sensing the data state of the second memory cell by applying a particular sensing voltage to a selected access line to which the first memory cell and the second memory cell are coupled, the particular sensing voltage based, at least partially, on the determined effect on the second data line.

A number of embodiments of the present disclosure can reduce sensing errors (e.g., read errors) caused by charge storage structure-charge storage structure (e.g., FG-FG) coupling as compared to previous sensing approaches, for instance. As an example, the data states of memory cells adjacent to a target cell to be read can be determined prior to the target cell being read. As such, in a number of embodiments, the sensing voltage applied to a selected access line to which the target cell and the adjacent memory cells are coupled can be determined (e.g., adjusted, selected and/or varied), depending on the status information (e.g., programmed status) of the adjacent cells, for instance. A number of embodiments of the present disclosure can reduce the circuit complexity associated with a memory array by incorporating the programmed status of adjacent memory cells into a read operation performed on a target cell without the use of shift logic coupled between adjacent data line control components, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 700 in FIG. 7. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines (e.g., word lines) 105-1, . . . , 105-N and intersecting data lines (e.g., bit lines) 107-1, 107-2, 107-3, . . . , 107-M. For ease of addressing in the digital environment, the number of word lines 105-1, . . . , 105-N and the number of bit lines 107-1, 107-2, 107-3, . . . , 107-M can be some power of two (e.g., 256 word lines by 4,096 bit lines), for instance.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, the non-volatile memory cells 111-1, . . . , 111-N include a source, a drain, a charge storage structure, such as a floating gate, and a control gate. The non-volatile memory cells 111-1, . . . , 111-N have their control gates coupled to a word line, 105-1, . . . , 105-N respectively. A "column" of the non-volatile memory cells includes a number of strings 109 coupled to a given local bit line 107. A "row" of the non-volatile memory cells are those memory cells commonly coupled to a given word line 105-1, . . . , 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

Subsets of cells (in a SBL architecture) or all of the cells (in an ABL architecture) coupled to a selected word line, e.g., 105-1, . . . , 105-N, can be programmed and/or sensed (e.g., read) together as a page of memory cells. A programming operation (e.g., a write operation) can include applying a number of programming pulses (e.g., 16V-20V) to a selected word line in order to increase the threshold voltage (Vt) of selected cells coupled to that selected access line to a desired program voltage level corresponding to a target (e.g., desired) data state.

In various instances, such as with a SBL architecture, the bit lines 107-1, . . . , 107-M can be separated into even numbered bit lines and odd numbered bit lines. In such cases, cells corresponding to a selected word line and even numbered bit lines can be programmed together and can be referred to as an even page of data. Similarly, cells corresponding to the selected word line and odd numbered bit lines can be programmed together and can be referred to as an odd page of data. The cells coupled to alternating even numbered and odd numbered bit lines (e.g., an even page and an odd page) can be programmed and/or sensed at different times. For instance, even pages associated with selected word lines can be programmed and/or sensed before the odd pages associated with the selected word lines. As noted above, and as described further herein, FG-FG coupling and/or bit line to bit line coupling can influence the determined data states of adjacent (e.g., neighboring) memory cells programmed and/or read at different times (e.g., as even pages and odd pages of data).

An erase operation can include applying a relatively high potential difference between the control gates of the memory cells and their channel regions in order to remove charge (e.g., electrons) from the charge storages structures of the cells. In a NAND array, a block of memory cells including multiple pages of memory cells can be erased together in an erase operation. For example, 20V can be applied to the substrate body and 0V can be applied to the control gates of the cells in a block of memory cells being erased. The high voltage erase pulse, or pulses, is intended to inject electrons from the charge storage structures of the memory cells into the substrate active area.

A sensing operation, such as a read or program verify operation, can include sensing a voltage and/or current change of a bit line coupled to a selected cell in order to determine the data state of the selected cell. The sensing operation can involve applying a signal to (e.g., driving or biasing) a bit line (e.g., bit line 107-1) associated with a selected memory cell above a signal (e.g., bias voltage) applied to a source line (e.g., source line 123) associated with the selected memory cell. A sensing operation may include precharging the bit line 107-1 followed with discharge when a selected cell begins to conduct, and sensing the discharge.

Sensing the data state of a selected cell can include applying a number of sensing signals (e.g., read voltages) to a selected word line while applying a number of pass signals (e.g., read pass voltages) to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the data state of a selected cell can be determined by the word line voltage at which the bit line current reaches a particular reference current associated with a particular data state.

As one of ordinary skill in the art will appreciate, in a sensing operation performed on a selected memory cell in a NAND string, the unselected memory cells of the string are biased so as to be in a conducting state. In such a sensing operation, the data state of the selected cell can be determined based on the current and/or voltage sensed on the bit line corresponding to the string. For instance, the data state of the selected cell can be determined based on whether the bit line current changes by a particular amount or reaches a particular level in a given time period. When the selected cell is in a conductive state, current flows between the source line contact at one end of the string and a bit line contact at the other end of the string. As such, the current associated with sensing the selected cell is carried through each of the other cells in the string and the select transistors.

As described further herein, capacitive coupling, such as FG-FG coupling between a target cell and adjacent memory cells coupled to a selected word line, can affect the Vt of a target cell. For instance, the target cell may be programmed to a particular Vt corresponding to a particular data state. The FG-FG coupling between the target cell and adjacent cells may shift the Vt of the target cell. The amount of shift associated with the FG-FG coupling can depend on factors such as the data state of the target cell's neighbors (e.g., whether one or both of the neighbor cells are programmed to an erased data state or to a non-erased data state). Therefore, maintaining a same particular sensing voltage to determine the particular data state can be less reliable than adjusting the particular sensing voltage based on the data states of the target cell's neighbors.

Figure 2:
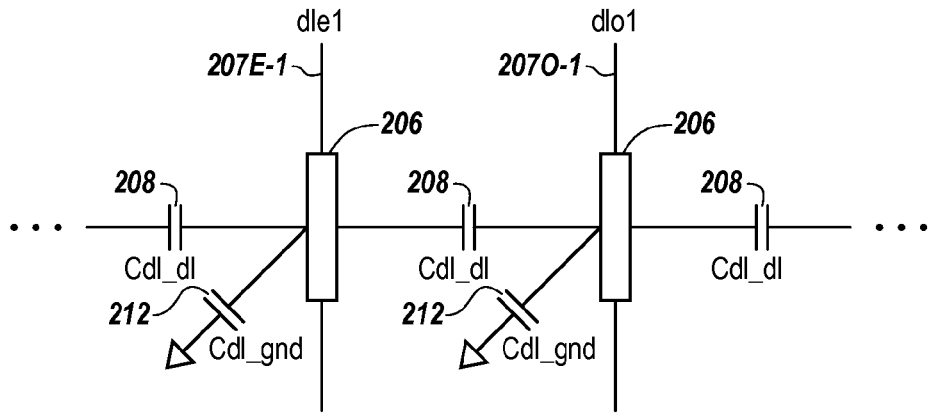
FIG. 2 illustrates an example of capacitive coupling associated with adjacent data lines.

FIG. 2 illustrates an example of capacitive coupling associated with adjacent data lines. The example shown in FIG. 2 includes a data line 207e-1 (dle1) and an adjacent data line 207o-1 (dlo1). The data line 207e-1 can be an "even" data line of a subset of even numbered data lines and that data line 207o-1 can be an "odd" data line of a subset of odd numbered data lines. As described further in connection with FIG. 4, pairs of adjacent even and odd data lines can be coupled to a same data line control component, such as a dynamic data cache (DDC), and/or other circuitry used to operate (e.g., program, read, and/or erase) memory cells coupled to a respective pair of data lines (e.g., 207e-1 and 207o-1).

Capacitors 208 represent a capacitive coupling between each pair of adjacent data lines (Cdl_dl) coupled to a particular access line. Capacitors 212 represent a capacitive coupling between each data line and a reference voltage (e.g., a ground voltage) to which the data line is coupled (Cdl_gnd). The amount of capacitive coupling between adjacent data lines (e.g., 208) and/or between the data lines and the ground voltage (e.g., 212) can depend on various factors such as the distance between the data lines 207e-1 and 207o-1 and the voltage on the data lines, among other factors.

Elements 206 represent the resistance of each respective data line (e.g., 207e-1 and 207o-1). The resistance of the data lines can depend on various factors such as the material type of the data lines and the physical dimensions of the data lines (e.g., length, diameter, etc.), among other factors.

The amount of voltage change (delta_v) experienced by a particular data line (e.g., a "victim" data line) due to capacitive coupling between the particular data line and its neighboring data lines (e.g., "aggressor" data lines) can be estimated as:

$$\text{delta\_}v = N^*(Vf-Vi)^*(Cdl\_dl/(2^*Cdl\_dl+Cdl\_gnd))$$

where (Vf−Vi) represents a voltage change of the aggressor data line and N represents the number of aggressor data lines experiencing the (Vf−Vi) voltage change (e.g., either zero, one, or two). As described further below, data line to data line capacitive coupling can be used, in association with data line sensing operations, to determine the programmed status of memory cells coupled to aggressor data lines, which can be used to determine appropriate sensing voltages for determining the data states of cells coupled to victim data lines.

Figure 3:
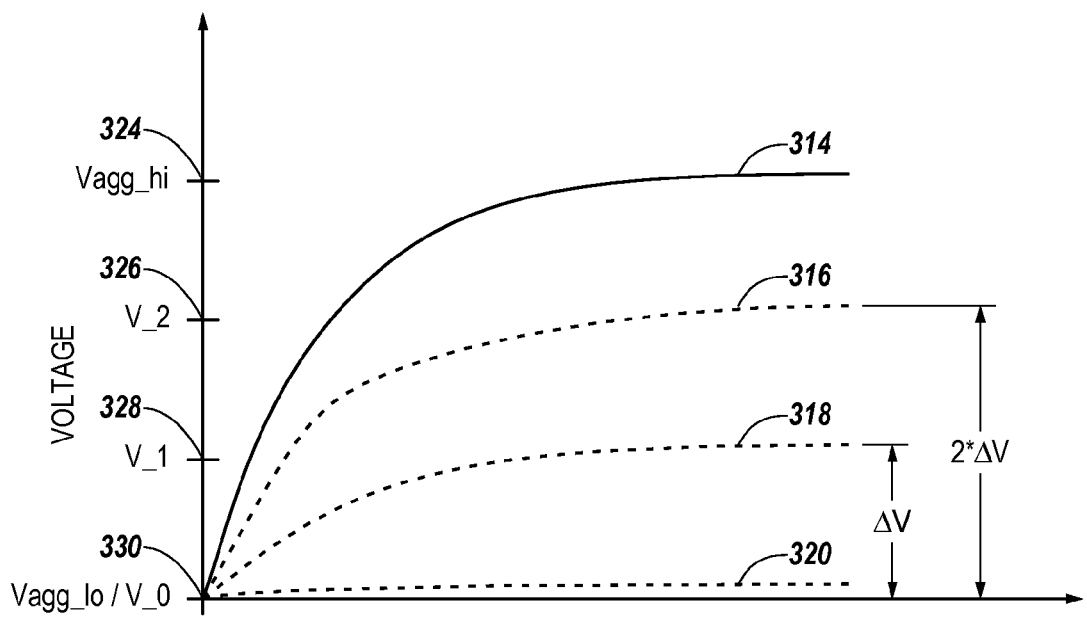
FIG. 3 is a timing diagram associated with data line to data line capacitive coupling in accordance with a number of embodiments of the present disclosure.

FIG. 3 is a timing diagram associated with data line to data line capacitive coupling in accordance with a number of embodiments of the present disclosure. In the timing diagram shown in FIG. 3, voltage signal 314 represents a voltage applied to an aggressor data line, which is charged from a reference voltage 330 (Vagg_lo/V_0) to a voltage 324 (Vagg_hi). The voltage 324 can be associated with a non-erased data state of a memory cell coupled to the aggressor data line and can be a value such as about 500 mV, for instance. The particular value of voltage 324 can vary depending on, for instance, the particular non-erased state of a number of non-erased states (e.g., in MLC operation) with which the voltage 324 is associated. The reference voltage 330 can be a ground voltage (e.g., 0 V), for instance, and can be associated with an erased data state of a memory cell coupled to the aggressor data line.

The voltage signals 316, 318, and 320 (shown as dashed lines) illustrate the effect (e.g., induced voltage change) on a victim data line in response to voltage changes on the aggressor data lines due, at least partially, to capacitive coupling between the aggressor and victim data lines. For instance, voltage signal 320 illustrates the voltage change on the victim data line if neither of the aggressor data lines adjacent to the victim data line are charged from reference voltage 330 to voltage 324 (e.g., both aggressor data lines remain at reference voltage 330).

Voltage signal 318 illustrates the voltage change (ΔV) induced on the victim data line responsive to one of the aggressor data lines being charged from the reference voltage 330 to voltage 324. As illustrated, the voltage on the victim data line changes (e.g., shifts) from the reference voltage 330 to voltage 328 (V_1). Voltage signal 316 illustrates the voltage change (2*ΔV) induced on the victim data line responsive to both of the aggressor data lines being charged from the reference voltage 330 to voltage 324. As illustrated, the voltage on the victim data line changes from the reference voltage 330 to voltage 326 (V_2).

As such, if voltage signal 314 is applied to neither of the two aggressor data lines (e.g., both aggressor data lines remain at the reference voltage 330), then the victim data line does not experience a voltage shift due to capacitive coupling effects from the aggressor data lines. However, if voltage signal 314 is applied to either one or both of the two aggressor data lines, then the victim data line does experience a voltage shift due to capacitive coupling effects from the aggressor data lines. In this example, the voltage induced on the victim data line is ΔV (e.g., V_1–V_0) if one of the aggressor data lines receives voltage signal 314 and 2*ΔV (e.g., V_2–V_0) if both of the aggressor data lines receive voltage signal 314.

Referring back to FIG. 2, the variable "delta_v" can correspond to ΔV illustrated in FIG. 3, the variable "N" can correspond to the number of aggressor data lines to which voltage signal 314 is applied, the variable "Vf" can correspond to voltage 324 (Vagg_hi), and the variable "Vi" can correspond to voltage 330 (Vagg_lo/V_0). That is, if "N" equals zero, then there is no voltage shift experienced by the victim data line due to data line to data line capacitive coupling. If "N" equals one or two, then there is a voltage shift delta_v given by the equation shown above, with delta_v being doubled if N=2 (e.g., if both aggressors experience a voltage change of Vagg_hi–Vagg_lo).

As described further below, determining the voltage shift induced on a victim data line due to capacitive coupling between the victim data line and its neighboring aggressor data lines can be used in association with performing a read operation on a memory cell coupled to the victim data line and to a selected access line. As an example, in a number of embodiments of the present disclosure, the induced voltage on a victim data line can be sensed to determine the programmed status of the memory cells coupled to aggressor data lines and to the selected access line (e.g., whether the aggressor memory cells are in a non-erased or erased data state). The information regarding the determined programmed status of the aggressor memory cells can be incorporated into the read operation performed on the victim memory cell. As an example, the particular sensing voltage applied to the selected access line in order to read the data state of the victim memory cell can be determined (e.g., selected and/or adjusted) based on the programmed status (e.g., determined data states) of the aggressor memory cells. For instance, a first sensing voltage can be applied to the selected access line if it is determined that neither of the aggressor memory cells are in a non-erased data state (e.g., a data state other than an erased data state), a second sensing voltage can be applied to the selected access line if it is determined that one of the aggressor memory cells is in a non-erased data state, and third sensing voltage can be applied to the selected access line if it is determined that both of the aggressor memory cells is in a non-erased data state.

Figure 4:
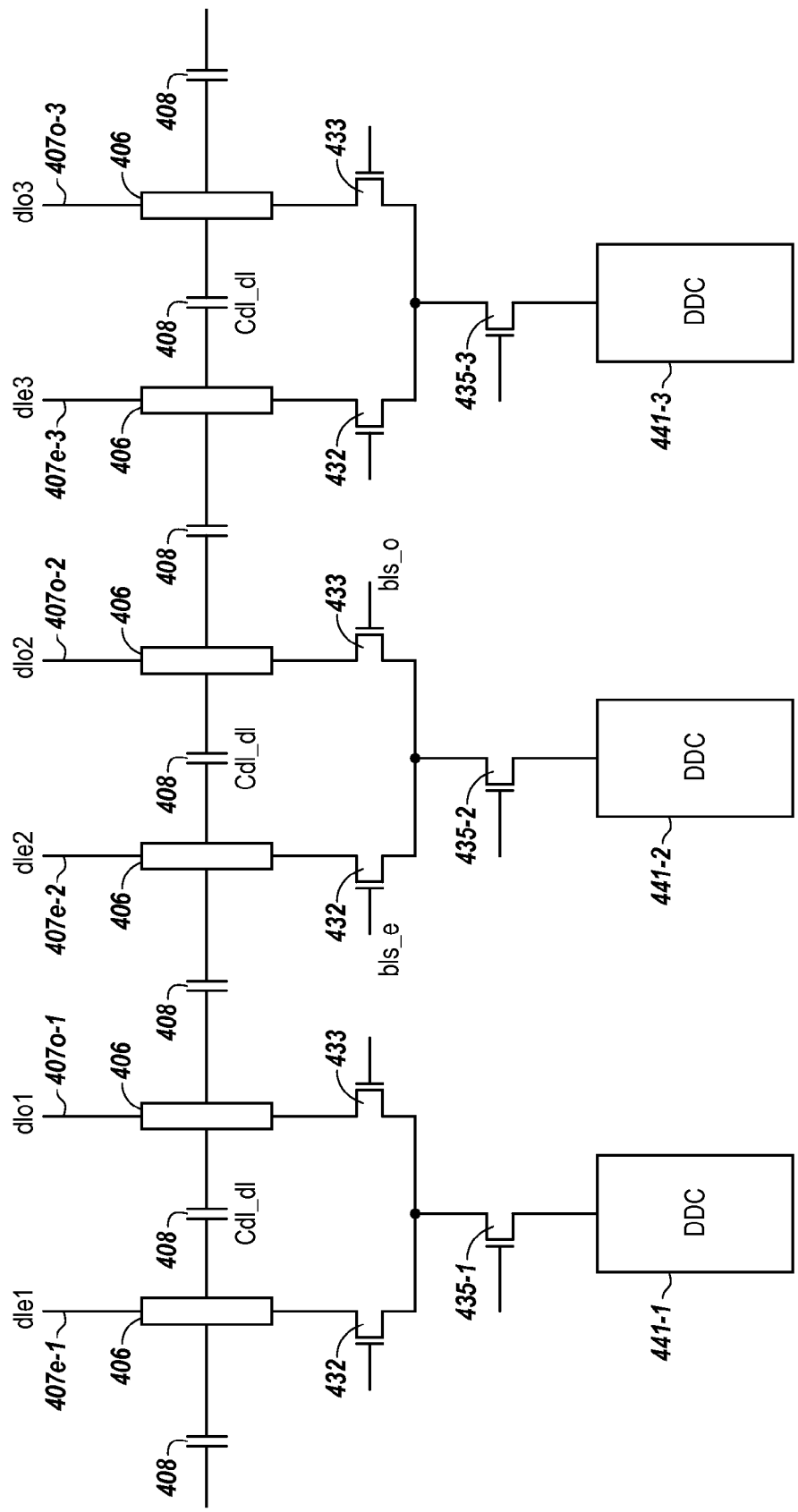
FIG. 4 is a schematic of a portion of a memory array including data line control components shared by adjacent pairs of data lines in accordance with a number of embodiments of the present disclosure.

FIG. 4 is a schematic of a portion of a memory array including data line control components shared by adjacent pairs of data lines in accordance with a number of embodiments of the present disclosure. In this example, respective pairs of even and odd numbered adjacent data lines share a common data line control component (e.g., a DDC). For instance, even numbered data line 407e-1 (dle1) and odd numbered data line 407o-1 (dlo1) share a common DDC 441-1, data lines 407e-2 (dle2) and 407o-2 (dlo2) share a common DDC 441-2, and data lines 407e-3 (dle3) and 407o-3 (dlo3) share a common DDC 441-3. The data lines illustrated in FIG. 4 can be data lines such as those illustrated in FIGS. 1 and 2, for example.

The array shown in FIG. 4 includes a number of isolation devices (e.g., transistors) 435-1, 435-2, and 435-3, which can be operated (e.g., turned on/off via application of a control signal) to connect one of the data lines of an even/odd pair to a respective one of the DDCs 441-1, 441-2, and 441-3. The array shown in FIG. 4 also includes transistors 432 and 433, which can be operated to select which one of data lines of the respective even/odd pair of data lines (e.g., 407e-1/407o-1, 407e-2/407o-2, 407e-3/407o-3) is to be connected to a respective DDC 441-1, 441-2, and 441-3. For example, a control signal "bls_e" can be used to control the transistors 432, and a control signal "bls_o" can be used to control the transistors 433.

The DDCs 441-1, 441-2, and 441-3 can, for instance, receive (e.g., via a host and/or controller) data to be programmed to memory cells coupled to a respective even/odd pair of data lines 407e-1/407o-1, 407e-2/407o-2, 407e-3/407o-3. Similarly, the DDCs 441-1, 441-2, and 441-3 can transmit data to be read from memory cells coupled to a respective even/odd pair of data lines 407e-1/407o-1, 407e-2/407o-2, 407e-3/407o-3 (e.g., in response to a read request from a host and/or controller). As such, subsets of memory cells coupled to a selected access line can be programmed and/or read at different times. For example, memory cells coupled to a selected access line and to even data lines (e.g., 407e-1, 407e-2, 407e-3, etc.) can be programmed and/or read at the same time (e.g., in parallel) and memory cells coupled to the selected access line and to odd data lines (e.g., 407o-1, 407o-2, 407o-3, etc.) can be programmed and/or read in parallel.

Some prior memory arrays include a separate data line control component (e.g., DDC) for each data line, which can allow an entire row of memory cells to be programmed and/or read in parallel. However, providing a DDC for each data line can increase the physical footprint of the array as compared to an array in which a DDC is shared by two or more data lines. Also, programming and/or reading an entire row of memory cells in parallel can have drawbacks, such as increased program and/or read disturb effects as compared to an architecture employing shared DDCs, for example.

In the example illustrated in FIG. 4, capacitors 408 represent a data line to data line capacitive coupling (Cdl_dl) between adjacent data lines 407e-1, 407o-1, 407e-2, 407o-2, 407e-3, 407o-3. The amount of capacitive coupling between adjacent data lines can depend on various factors such as the distance between the data lines and the voltage on the data lines, among other factors. Elements 406 represent the resistance of each respective data line 407e-1, 407o-1, 407e-2, 407o-2, 407e-3, 407o-3. The resistance of the data lines can depend on various factors such as the material type of the data lines and the physical dimensions of the data lines (e.g., length, diameter, etc.), among other factors.

As described above in connection with FIGS. 2 and 3, a voltage change on a first data line can shift the voltage on a second data line adjacent the first data line due, at least partially, to data line to data line capacitive coupling between the adjacent data lines. The first data line (e.g., the data line causing the voltage shift of the adjacent data line) can be called an aggressor and the second data line (e.g., the data line experiencing the voltage shift due to capacitive coupling) can be called a victim.

As an example, in operation, cells coupled to even data lines (e.g., 407e-1, 407e-2, 407e-3) may be programmed to their target (e.g., final) data states prior to cells coupled to odd data lines (e.g., 407o-1, 407o-2, 407o-3). As a result, the subsequent programming of the cells coupled to the odd data lines may shift the programmed Vt of the even data lines (e.g., due to capacitive coupling). As such, the cells coupled to even data lines are victim cells and the cells coupled to adjacent odd data lines are aggressor cells. Determining status information (e.g., the programmed status) of the aggressor cells (e.g., the particular data states of aggressor cells) can be useful in sensing (e.g., reading) the data states of the victim cells. For instance, the status information of an aggressor cell (e.g., whether an aggressor cell is in an erased data state or a non-erased data state) can indicate whether or not the Vt of the aggressor cell changed during its programming. A Vt change of an aggressor cell can cause a Vt change of the victim (e.g., due to capacitive coupling). As such, the sensing voltage applied to the selected access line to sense the data state of a victim cell (e.g., in a read operation) can be adjusted depending on the particular data states of the aggressor cells.

Therefore, it can be beneficial to incorporate status information of aggressor memory cells into a sensing (e.g., read) operation performed on a victim memory cell. However, in instances such as FIG. 4, in which pairs of data lines share one common data line control component (e.g., DDC), it can be difficult to provide determined status information (e.g., the data states) of both aggressor cells to the DDC associated with the victim data line.

As an example, consider the case of a request to sense the data state of a cell coupled to a selected access line and to even data line 407e-2, such that data line 407e-2 is a victim data line and data lines 407o-1 and 407o-2 are the two aggressor data lines. In such instances, a read operation can be performed on the aggressor cells (e.g., the cells coupled to odd data lines 407o-1 and 407o-2) in response to the request to sense the data state of the victim cell (e.g., the cell coupled to even data line 407e-2). The DDC 441-2 shared by the victim data line 407e-2 and the aggressor data line 407o-2 can be used to determine the data state, and can store the determined data state, of the aggressor cell coupled to data line 407o-2. Similarly, DDC 441-1 can be used to determine the data state, and can store the determined data state, of the aggressor cell coupled to data line 407o-1. Although the DDC associated with the victim data line (e.g., DDC 441-2 associated with data line 407e-2, in this example) stores the data state of the aggressor cell coupled to the aggressor data line that shares the same DDC (e.g., data line 407o-2 associated with shared DDC 441-2), it can be difficult for the DDC associated with the victim data line (e.g., DDC 441-2, in this example) to obtain the status information of the aggressor cell stored in the adjacent DDC (e.g., DDC 441-1). In some instances, determining the data states of the aggressor cells may include reading stored data states (e.g., from a data cache) corresponding to the aggressor cells. For instance, the data states of the aggressor cells may already be stored in respective DDCs (e.g., from a previous read operation) at the time of a request to sense the data state of a victim cell. As such, a separate read operation of the aggressor cells responsive to the request to sense the data state of a victim cell may not be required.

In some previous approaches, in order for a data line control component to obtain the programmed status of both aggressor cells, data transfer circuitry (e.g., shift logic in the form of a number of data transfer devices, such as transistors) is used to a transfer a stored data state corresponding to an aggressor memory cell from one DDC to another (e.g., from DDC 441-1 to DDC 441-2). However, such approaches can increase the circuit complexity associated with the array, among other drawbacks.

In contrast, in a number of embodiments of the present disclosure, a shared data line control component (e.g., DDC 441-1, 441-2, 441-3) can incorporate the programmed status of both aggressor memory cells into a read operation performed on a victim memory cell, without the use of data transfer circuitry between adjacent shared data line control components. For instance, a number of embodiments of the present disclosure can utilize a data line to data line capacitive coupling effect between victim and aggressor memory cells to determine the programmed status of aggressor memory cells. The programmed status of the aggressor memory cells can then be used to determine (e.g., select and/or adjust) a sensing voltage used to determine the data state of a victim memory cell.

A number of methods for operating a memory (e.g., a memory device and/or memory of a system), which includes an array such as that illustrated in FIG. 4, can include determining a data state of a first memory cell (e.g., an aggressor memory cell) coupled to a first data line (e.g., an aggressor data line) in response to a request to sense a data state of a second memory cell (e.g., a victim memory cell) coupled to a second data line (e.g., a victim data line) adjacent the first data line. In a number of embodiments, the first and second data lines share a common data line control component (e.g., DDC). In a number of embodiments, the first data line shares a data line control component with another data line, and the second data line shares a data line control component with another data line, but the first and second data lines do not share the same data line control component. For instance, odd numbered data line 407o-1 can be a first data line (first aggressor), which shares DDC 441-1 with data line 407e-1, and even numbered data line 407e-2 can be a second data line (victim), which shares DDC 441-2 with data line 407o-2. In this example, data line 407o-2 is adjacent the victim data line 407e-2 and can be considered a second aggressor. In a number of embodiments, the method can include determining the data state of both aggressor memory cells adjacent the victim memory cell in response to the request the sense the data state of the victim. For instance, the data state of an aggressor memory cell coupled to data line 407o-1 and the data state of an aggressor memory cell coupled to data line 407o-2 can be determined in response to a request to sense the date state of a victim memory cell coupled to data line 407e-2.

The determined data states of the aggressor memory cells can be stored in their respective data line control components (e.g., the data state of the aggressor memory cell coupled to data line 407o-1 can be stored in DDC 441-1 and the data state of the aggressor memory cell coupled to data line 407o-2 can be stored in DDC 441-2). As such, the data line control component (e.g., 441-2) associated with the victim data line (e.g., 407e-2) stores the determined data state of the aggressor memory cell coupled to the aggressor data line associated with the same data line control component (e.g., shared DDC 441-2).

In a number of embodiments, capacitive coupling (e.g., 408) between adjacent data lines (e.g., between 407e-2 and 407o-1 and between 407e-2 and between 407o-2) can be utilized to determine status information of the aggressor memory cells. For example, the status information can include the programmed status of the aggressor memory cells (e.g., whether zero, one, or both of the memory cells coupled to aggressor data lines 407o-1 and 407o-2 are in a first data state (e.g., an erased data state) or a second data state (e.g., a non-erased data state)). The determination of how many of the aggressor cells are in the first data state versus the second data state can be used to determine a particular sense voltage to be applied to the selected access line corresponding to the victim and to the aggressor memory cells in order to sense the data state of the victim memory cell. In a number of embodiments of the present disclosure, the aggressor and/or victim memory cells can be multilevel cells (MLCs). That is, embodiments are not limited to SLC memory cells. As such, a non-erased data state (e.g., the second data state in the example above) can be one of a number of different data states.

Determining the programmed status of the aggressor memory cells (e.g., whether the aggressor cells are in the first data state or the second data state) can include, for example, applying a reference voltage to the aggressor data lines (e.g., 407o-1 and 407o-2) and to the victim data line (e.g., 407e-2). As an example, the reference voltage applied to the aggressor and victim data lines can be a voltage associated with the first data state (e.g., an erased data state), such as a ground voltage (e.g., 0V), for instance. However, embodiments are not limited to a particular reference voltage. For instance, the reference voltage applied to the aggressor and victim data lines can be a voltage associated with the second data state (e.g., a non-erased data state), such as 500 mV, for instance.

Determining the programmed status of the aggressor memory cells can further include floating the victim data line (e.g., such that the reference voltage is floating on the victim data line), while the voltage on the aggressor data lines is adjusted from the reference voltage to an adjusted voltage associated with the previously determined data state of the respective aggressor memory cell that is stored in the respective data line control component. For instance, while the victim data line 407e-2 is floating, the voltage on aggressor data line 407o-1 can be adjusted from the reference voltage to a voltage associated with the previously determined data state of the aggressor memory cell that is stored in DDC 441-1, and the voltage on aggressor data line 407o-2 can be adjusted from the reference voltage to a voltage associated with the previously determined data state of the aggressor memory cell that is stored in DDC 441-2. That is, the aggressor data lines can be charged (e.g., via the associated DDC) from a reference voltage to a voltage corresponding to the data state stored in the respective DDC and corresponding to the particular aggressor cell, while the victim data line is floated. Since the victim data line (e.g., 407e-2) is floating, and due, at least partially, to data line to data line capacitive coupling, a voltage change on the aggressor data lines (e.g., 407o-1 and 407o-2) effects the victim data line (e.g., by inducing a voltage change on the victim data line). The effect (e.g., induced voltage change) on the victim data line due, at least in part, to the voltage change on the aggressor data lines, can be subsequently determined by performing a number of sensing operations on the victim data line (e.g., to determine whether the voltage on the victim data line is different than the reference voltage).

Performing the number of sensing operations can include performing a first sensing operation to determine if a voltage on the victim data line has changed from the reference voltage to at least a first voltage threshold level (e.g., a voltage threshold level indicative of whether at least one of the aggressor memory cells is programmed to a particular data state), and performing a second sensing operation to determine if the voltage on the victim data line has changed from the reference voltage to at least a second voltage threshold level (e.g., a threshold voltage level indicative of whether both of the aggressor memory cells are programmed to the particular data state). As such, a determination as to whether zero, one, or both aggressor memory cells are programmed to a particular data state can be made by performing the number of sensing operations on the victim data line.

In a number of embodiments, a single sensing operation can be performed on a victim data line to determine the programmed status of both aggressor cells adjacent to a victim cell. For instance consider the example in which data line 407e-2 is the victim data line. Since the victim data line 407e-2 shares DDC 441-2 with aggressor data line 407o-2, the data state of the aggressor cell coupled to data line 407o-2 is stored in DDC 441-2 (e.g., from the initial read operation performed on the aggressor cell). To determine the data state of the other aggressor cell (e.g., the cell coupled to aggressor data line 407o-1), which does not share a DDC with the victim data line (e.g., DDC 441-2), the aggressor data line 407o-1 can be adjusted from a reference voltage (e.g., a ground voltage) to an adjusted voltage corresponding to the data state of the aggressor cell coupled to aggressor data line 407o-1, while the victim data line 407e-2 is floated and the aggressor data line 407o-2 is held (e.g., at the reference voltage through DDC 441-2). In this case, the victim data line 407e-2 is prevented from experiencing coupling from aggressor data line 407o-2 (e.g., because it is being held through DDC 441-2), but it can experience coupling from aggressor data line 407o-1 (e.g., depending on the data state of the aggressor cell coupled to data line 407o-1). Since the victim data line 407e-2 experiences coupling from only one of the aggressor data lines, a single sensing operation can be performed on victim data line 407e-2 to determine the data state of the aggressor cell coupled to aggressor data line 407o-1. This process can be performed on victim data lines coupled to even numbered DDCs (e.g., 441-2) and then can be performed on victim data lines coupled to odd numbered DDCs (e.g., 441-1, 441-3, etc.).

In a number of embodiments, performing the sensing operations on the victim data line (e.g., to determine the effect on the victim data line due the voltage change on the aggressor data lines) includes floating both of the aggressor data lines at their respective adjusted voltage (e.g., at the voltages corresponding to the respective stored data states of the aggressor data cells) while sensing the victim data line. For instance, in the example in which data line 407e-2 is the victim data line, the aggressor data lines 407o-1 and 407o-2 can be floated while one or more sensing operations are performed on the victim data line 407e-2. Since the aggressor data lines are floated while sensing the victim data line, changes to the voltage on the victim data line due to the sensing operation can effect the voltages on the aggressor data lines (e.g., due to capacitive coupling between adjacent data lines).

As such, in a number of embodiments, a "clean up" operation can be performed to adjust the voltage on those aggressor data lines effected by voltage changes on the victim data line that result from performing a sensing operation on the victim data lines. The clean up operation can include adjusting (via a data line control component) the voltage on a victim data line, while floating the aggressor data lines, such that the aggressor data lines experience (e.g., due to capacitive coupling) a voltage change sufficient to compensate for the voltage change experienced by the aggressor data lines resulting from the sensing of the victim data lines. The clean up operation can include, for example, adjusting the victim data line back to the reference voltage (e.g., the reference voltage to which the victim data line was charged prior to being effected by the adjustment of the voltage on one or both of the aggressor data lines). An example of a clean up operation in accordance with embodiments of the present disclosure is described further below in connection with FIGS. 5A and 5B. A number of embodiments of the present disclosure include performing an additional sensing operation on a victim data line subsequent to the clean up operation.

The determined effect (e.g., induced voltage) on the victim data line due to the adjusting of the voltages on the aggressor data lines (e.g., by performing the number of sensing operations on the victim data line) can indicate the programmed status of the aggressor memory cells (e.g., whether both aggressor cells are in the first data state, whether one of the aggressor cells is in the second data state, or whether both aggressor cells are in the second data state). The determined programmed status of the aggressor memory cells can be used to determine a particular sensing voltage to be applied to the selected access line, to which the victim memory cell and aggressor memory cells are coupled, in order to sense the data state of the victim memory cell. For instance, the particular sensing voltage used to determine the data state of the victim memory cell can be adjusted based on the data states of the respective aggressor memory cells.

Figure 5A:
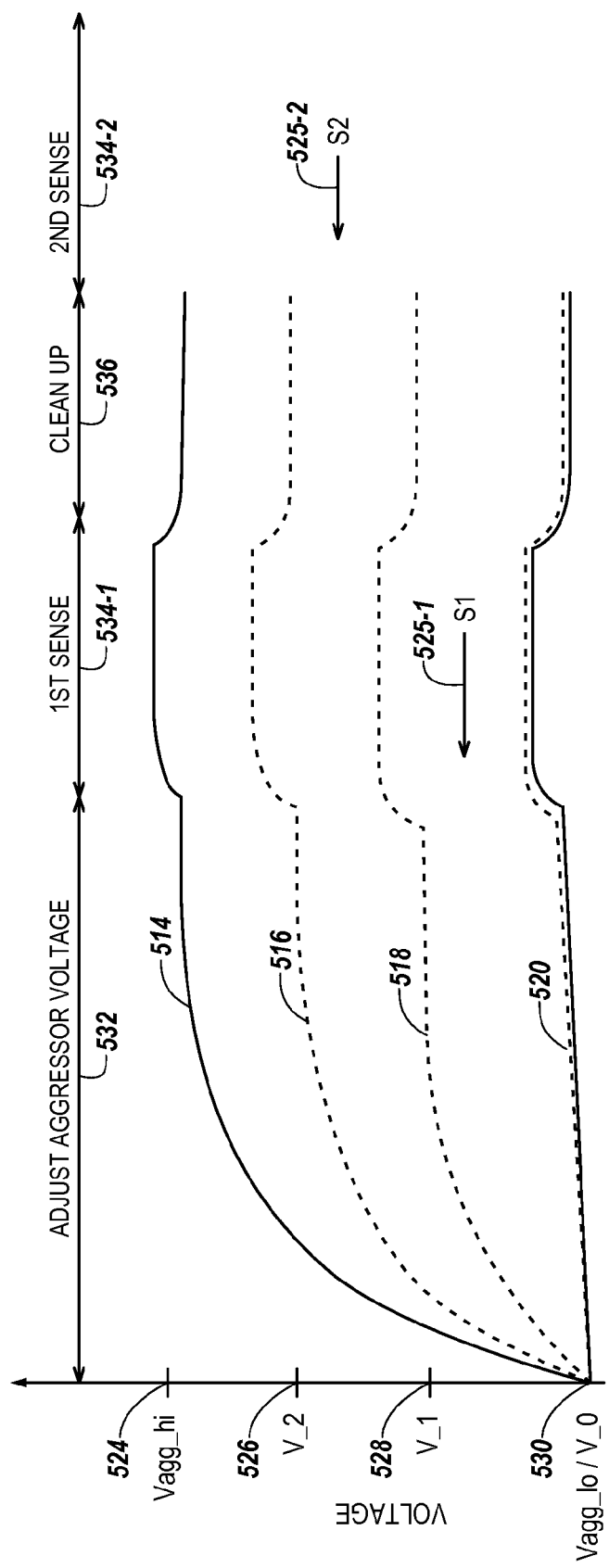
FIG. 5A is a timing diagram associated with operating a memory in accordance with a number of embodiments of the present disclosure.

FIG. 5A is a timing diagram associated with operating a memory apparatus in accordance with a number of embodiments of the present disclosure. The timing diagram of FIG. 5A illustrates a number of voltage signals associated with sensing the data states of victim memory cells of an array of memory cells such as those shown above in FIGS. 1 and 4, for example. Time period 532 ("Adjust Aggressor Voltage") corresponds to a time period in which the voltage on aggressor memory cells is adjusted from a reference voltage to an adjusted voltage associated with the previously determined data state of the respective aggressor cell (e.g., the data state stored in the respective data line control component associated with the respective aggressor data line), as described above in connection with FIG. 4. As such, during time period 532, the victim data lines are floated and the voltage on the aggressor data lines are adjusted based on the previously determined data states of the aggressor cells. In this example, voltage 530 (Vagg_lo/V_0) is the reference voltage and is associated with a first data state (e.g., an erased data state). Voltage 524 (Vagg_hi) is associated with a second data state (e.g., a non-erased data state). As an example, reference voltage 530 can be about 0V and voltage 524 can be about 500 mV; however, embodiments are not limited to a voltage levels for voltages 530 and/or 524. As represented by voltage signal 520, during time period 532, those aggressor data lines coupled to an aggressor memory cell at the first data state remain at reference voltage 530 (e.g., the voltage on those aggressor data lines is not adjusted from reference voltage 530). As represented by voltage signal 514, the voltage on those aggressor data lines coupled to an aggressor memory cell at the second data state is adjusted (e.g., the voltage on those aggressor data lines is adjusted from reference voltage 530 to voltage 524).

The voltage signals 516, 518, and 520 (shown as dashed lines) illustrate the effect (e.g., induced voltage change due, at least partially, to capacitive coupling between the aggressor and victim data lines) on victim data lines based, at least partially, on whether the voltages applied to the aggressor data lines are adjusted during time period 532. For instance, voltage signal 520 illustrates the voltage change induced on victim data lines if neither of the aggressor data lines adjacent to the victim data line are charged from reference voltage 530 to voltage 524 (e.g., both aggressor data lines remain at reference voltage 530). That is, voltage signal 520 corresponds to a case in which the aggressor memory cell coupled to each of the respective aggressor data lines is at the first data state. As such, since the voltage on the aggressor data lines is not adjusted from reference voltage 530, the voltage on the victim data line does not change. Voltage signal 518 illustrates the voltage change induced on victim data lines if one of the aggressor data lines is charged from the reference voltage 530 to voltage 524. That is, voltage signal 518 corresponds to a case in which the aggressor memory cell coupled to one of the aggressor data lines is at the first data state and the other is at the second data state. As such, since the voltage on one of the aggressor data lines is adjusted from reference voltage 530 to voltage 524, the voltage of the victim-data line also changes (e.g., from reference voltage 530 to voltage 528 (V_1) due, at least partially, to capacitive coupling effects). Voltage signal 516 illustrates the voltage change induced on the victim data line if both of the aggressor data lines are charged from the reference voltage 530 to voltage 524. That is, voltage signal 516 corresponds to a case in which the aggressor memory cell coupled to each of the respective aggressor data lines is at the second data state. As such, since the voltage on both aggressor data lines is adjusted from reference voltage 530 to voltage 524, the voltage of the victim data line also changes (e.g., from reference voltage 530 to voltage 526 (V_2) due, at least partially, to capacitive coupling effects).

As such, after the voltages on the aggressor data lines are adjusted based on the determined data states of their respective aggressor memory cells (e.g., subsequent to time period 532), the voltage on the victim data lines can be either voltage 530 (e.g., if neither aggressor cell is at the second data state), voltage 528 (e.g., if one of the aggressor memory cells is at the second data state), or voltage 526 (e.g., if both aggressor memory cells are at the second data state).

Therefore, the voltage on the victim data lines subsequent to time period 532 can be determined, and the determined voltage correlates with the programmed status of the aggressor cells coupled to the associated aggressor data lines (e.g., the determined voltage indicates whether zero, one, or both of the aggressor memory cells is at the second program state). As described herein, the programmed status information can be incorporated into a read operation performed on a number of victim memory cells. As an example, the particular sensing voltage applied to the selected access line in order to read the data state of a victim memory cell can be determined (e.g., selected and/or adjusted) based on the determined programmed status of the aggressor memory cells.

Determining the voltage on the victim data lines subsequent to time period 532 can include performing a number of sensing operations on the victim data lines. Performing the number of sensing operations on the victim data lines can include performing at least a first sensing operation to determine if the voltage on the respective victim data lines has changed from the reference voltage to at least a first voltage threshold level, and a second sensing operation to determine if the voltage on the respective victim data lines has changed from the reference voltage to at least a second voltage threshold level.

As an example, in FIG. 5A, time period 534-1 ("1$^{st}$ Sense") corresponds to a first sensing operation performed on a number of victim data lines subsequent to time period 532. The first sensing operation includes determining if a voltage on the respective victim data lines has changed from the reference voltage 530 to at least a first voltage threshold level 525-1 (S1). In a number of embodiments, and as shown in the example of FIG. 5A, the first voltage threshold level 525-1 can be a voltage between the reference voltage 530 and voltage 528. As such, a determination, during sensing operation 534-1, that the voltage of a victim data line is below threshold level 525-1 indicates that the aggressor memory cells coupled to the aggressor data lines associated with the victim data line are at a first data state (e.g., an erased data state). A determination that the voltage of a victim data line is at or above threshold level 525-1 indicates that at least one of the aggressor memory cells is at a second data state (e.g., a non-erased data state).

As an example, the data line control component associated with the victim data line can include sensing circuitry configured to determine whether the voltage on the victim data line is above or below the first voltage threshold level 525-1 during the first sense operation 534-1. For instance, the sensing circuitry may be configured to sense conduction of current on the victim data line responsive to the voltage on the victim data line being below the threshold level 525-1. As described further in connection with FIG. 5B, sensed conduction of current during sensing operation 534-1 can be referred to as "passing" the sensing operation, and the absence of sensed current conduction can be referred to as "failing" the sensing operation.

In a number of embodiments, the aggressor data lines can be floated during the first sensing operation 534-1. As such, current conduction on the victim data line (e.g., responsive to the first sensing operation) can change (e.g., increase) the voltage on the victim data line. As shown in FIG. 5A, such a voltage change on the victim data line can change the voltage on the floating aggressor data lines and other victim data lines which can be due, at least partially, to data line to data line capacitive coupling effects. In a number of embodiments, a clean up operation can be performed subsequent to the first sensing operation (e.g., 534-1) to compensate for voltage changes on aggressor and/or victim data lines which result from performing the first sensing operation 534-1. Time period 536 ("Clean Up") shown in FIG. 5A illustrates the results of such a clean up operation. The clean up operation 536 can include adjusting the voltage on those victim data lines determined to have conducted current during sensing operation 534-1 (e.g., those victim data lines have a voltage below threshold level 525-1), to the reference voltage 530, while floating the aggressor data lines. As such, the voltage reduction on the victim data lines causes a reduction to the voltage on the floating aggressor data lines (e.g., due to capacitive coupling effects), which compensates for the voltage increase on the aggressor data lines during the first sensing operation 534-1.

In a number of embodiments, a second sensing operation can be performed to determine if the voltage on the respective victim data lines has changed from the reference voltage to at least a second voltage threshold level. As an example, in FIG. 5A, time period 534-2 ("2$^{nd}$ Sense") corresponds to a second sensing operation performed on a number of victim data lines subsequent to time period 532. The second sensing operation includes determining if a voltage on the respective victim data lines has changed from the reference voltage 530 to at least a second voltage threshold level 525-2 (S2). In a number of embodiments, and as shown in the example of FIG. 5A, the second voltage threshold level 525-2 can be a voltage between voltage 528 (V_1) and voltage 526 (V_2). As such, a determination, during sensing operation 534-2, that the voltage of a victim data line is below threshold level 525-2 indicates that at least one of the aggressor memory cells coupled to the aggressor data lines associated with the victim data line is at the second data state (and the other is at the first data state). A determination that the voltage of a victim data line is at or above threshold level 525-2 indicates that both of the aggressor memory cells are at the second data state (e.g., a non-erased data state).

The sensing circuitry of the data line control component (e.g., DDC) associated with the victim data line can be configured to determine whether the voltage on the victim data line is above or below the second voltage threshold level 525-2 during the second sense operation 534-2. For instance, the sensing circuitry may be configured to sense conduction of current on the victim data line responsive to the voltage on the victim data line being below the threshold level 525-2. As such, sensed current conduction during the second sense operation 534-2 can indicate that at least one of the aggressor cells is at the second data state and an absence of sensed current conduction can indicate that both aggressor cells are at the second data state.

Figures 5B, 6:
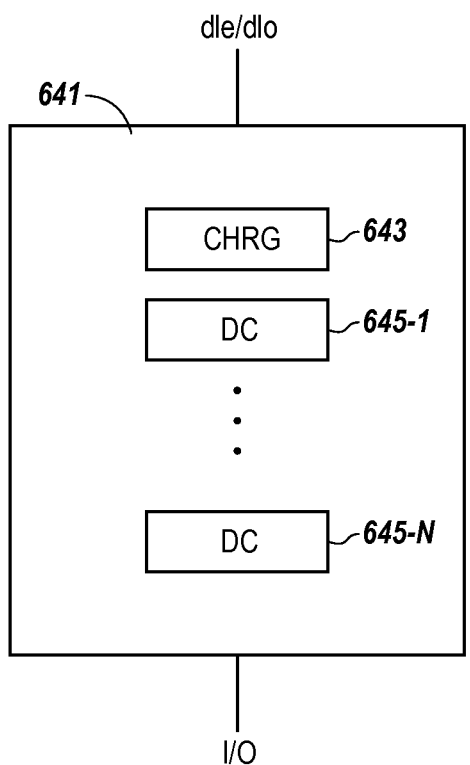
FIG. 5B is a table illustrating results associated with the timing diagram of FIG. 5A.
FIG. 6 is a block diagram illustrating a shared data line control component in accordance with a number of embodiments of the present disclosure.

FIG. 5B is a table 531 illustrating results associated with the timing diagram of FIG. 5A. The "results" column 537 of table 531 indicates the particular sensing voltage to be applied to a selected access line in order to determine the data state of a victim memory cell coupled to a victim data line. Column 537 indicates that a sensing voltage SV_0 is to be used if the first sense operation 534-1 performed on a victim data line passes (e.g., if the voltage on the victim data line is determined to be less than voltage threshold 525-1). Sensing voltage SV_1 is to be used if the first sense operation 534-1 performed on a victim data line fails and the second sense operation 534-2 passes. Sensing voltage SV_2 is to be used if the first sense operation 534-1 performed on a victim data line fails and the second sense operation 534-2 also fails. As such, sensing voltage SV_0 corresponds to a case in which neither of the aggressor memory cells is at the second data state (e.g., the data state associated with voltage 524). The sensing voltage SV_1 corresponds to a case in which one of the aggressor memory cells is at the second data state. The sensing voltage SV_2 corresponds to a case in which both of the aggressor memory cells are at the second data state.

Therefore, a different one of the sensing voltages SV_0, SV_1, and SV_2 can be selectively applied to the selected access line during a read operation performed on a victim memory cell depending on the programmed status of the aggressor memory cells as determined by sensing the victim data line in accordance with one or more embodiments described herein. In a number of embodiments the sensing voltage SV_0 is an unadjusted sensing voltage, the sensing voltage SV_1 is a first adjusted sensing voltage, and the sensing voltage SV_2 is a second adjusted sensing voltage. An unadjusted sensing voltage can refer to a sensing voltage which is not changed from an initial voltage associated with sensing a particular data state.

In various instances, subsets of cells coupled to a selected access line can be programmed and sensed (e.g., read) together as a group. For example, the cells coupled to even numbered data lines can be programmed and read as a group and the cells coupled to odd numbered data lines can be programmed and read as a group. Consider a case in which the even cells are programmed to their respective target (e.g., final) data states prior to the odd cells being programmed to their respective data states. In this case, the even cells can be considered victim cells because their Vt levels can be effected (e.g., shifted) due to the subsequent programming of the odd cells, which can be considered aggressor cells.

As described herein, in a number of embodiments of the present disclosure, the data states of the aggressor cells can be determined in response to a request to read the data states of the victim cells (e.g., victim cells coupled to a selected access line and which can correspond to a page of data). The particular sensing voltage used to read the data states of the victim cells can depend on the programmed status of the two aggressor cells adjacent each respective victim cell (e.g., whether zero, one, or both aggressor cells are at a non-erased data state or an erased data state). In cases in which the memory cells are MLCs, the particular sensing voltage used to read the data states of the victim cells can also depend on the particular non-erased states to which the aggressor cells are programmed (e.g., whether the aggressor cells are programmed to an uppermost non-erased data state or one of a number of intermediate non-erased data states). The particular sensing voltage to be used (e.g., to be applied to the selected access line) to read the victim cells can be determined in accordance with embodiments described herein. For instance, a first sensing voltage (e.g., SV_0) can be applied to the selected access line to read those victim cells whose adjacent aggressor cells are at a first data state (e.g., an erased data state), a second sensing voltage (e.g., SV_1) can be used to read those victim cells whose adjacent aggressor cells include a first aggressor at the first state and a second aggressor at a second state, and a third sensing voltage (e.g., SV_2) can be used to read those victim cells whose adjacent aggressor cells are both at the second data state (e.g., a non-erased data state).

FIG. 6 is a block diagram illustrating a shared data line control component 641 in accordance with a number of embodiments of the present disclosure. The data line control component 641 can be, for example, a dynamic data cache (DDC) such as DDCs 441-1, 441-2 and 441-3 described in connection with FIG. 4. The data line control component 641 can be shared by an even/odd pair of data lines (e.g., dle/dlo) of a memory array and can be selectively connected thereto via an isolation device such as isolation devices 435-1, 435-2, and 435-3 shown in FIG. 4. That is, the data line control component 641 can be included in an architecture in which each even/odd data line pair shares one data line control component.

The data line control component 641 can be used to operate a memory apparatus in accordance with embodiments described herein. For instance, component 641 can be used in association with reading memory cells in accordance with a number of embodiments of the present disclosure. In this example, the component 641 includes a charging component 643, which can be coupled to a voltage source (not shown) and configured to apply voltages to a selected data line of the even/odd pair (dle/dlo) to charge a selected data line to a particular voltage during a programming and/or sensing operation, for instance.

The data line control component 641 also includes a number of data cache (DC) components 645-1, . . . , 645-N. The data cache components 645-1, . . . , 645-N can include a number of temporary data caches (TDC), primary data caches (PDC), secondary data caches (SDC), and/or other circuitry that can be coupled to an external circuit (e.g., a processor or other external circuit) via an input/output (I/O) line. In a number of embodiments, the data line control component 641 can be used to determine the programmed status of an aggressor memory cell coupled to a data line other than its associated even/odd pair by sensing one of the data lines of the even/odd pair. The determined programmed status of the aggressor memory cell can be incorporated into a read operation performed on a target memory cell coupled to a victim data line of the even/odd pair. For instance, a particular sensing voltage used to determine the data state of the target memory cell can be selected based, at least partially, on the determined programmed status of the aggressor memory cell.

Figure 7:
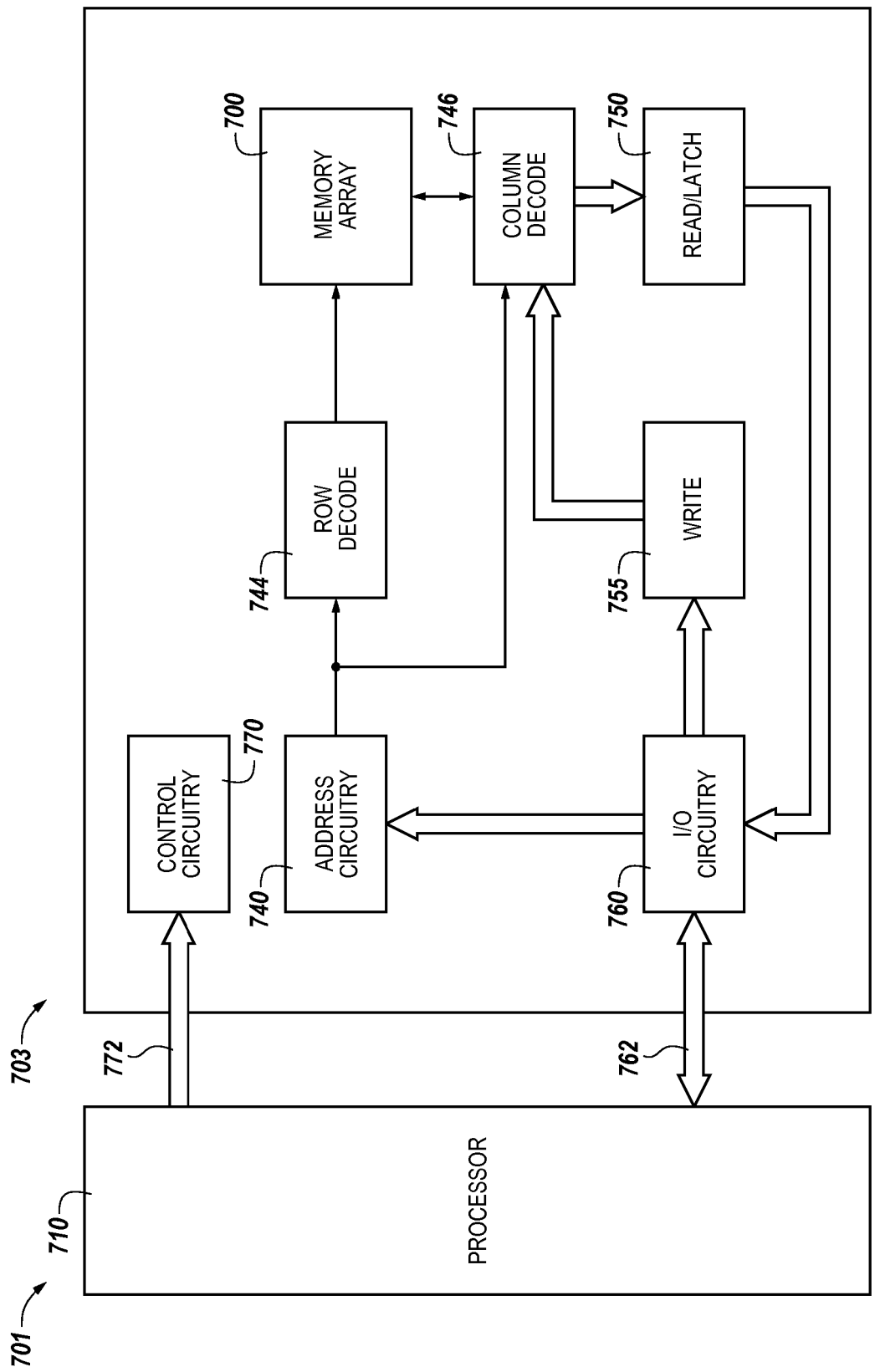
FIG. 7 illustrates a block diagram of an apparatus in the form of an electronic memory system having a memory device operated in accordance with a number of embodiments of the present disclosure.

FIG. 7 illustrates a block diagram of an apparatus in the form of an electronic memory system 701 having a memory device 703 operated in accordance with a number of embodiments of the present disclosure. The memory system 701 includes a host 710 (e.g., a number of processors, a computing device including a number of processors, and/or an application specific integrated circuit (ASIC), etc.), coupled to the memory device 703, which can itself be considered an "apparatus". The memory device 703 includes a memory array 700. The memory array 700 can be analogous to the memory array 100 previously described in connection with FIG. 1. Although one memory array 700 is shown in FIG. 7, embodiments of the present disclosure are not so limited.

The array 700 of memory device 703 can include, for example, floating gate flash memory cells with a NAND architecture, as previously described herein. The memory device 703 includes address circuitry 740 to latch address signals provided over I/O connections 762 through I/O circuitry 760. Address signals are received and decoded by a row decoder 744 and a column decoder 746 to access the memory array 700.

The memory device 703 includes a controller 770 (e.g., control circuitry) coupled to the memory array 700. The controller 770 can be configured to control performance of various operations such as sensing (e.g., read) operations on memory cells in accordance with one or more embodiments described herein.

The controller 770 can control sensing of data in the memory array 700 by, for example, by controlling sensing of voltage and/or current changes on data lines of the memory array using sensing circuitry that in this example can be read/latch circuitry 750. The read/latch circuitry 750 can include a number of data line control components, such as those described herein, which can be used to read and latch pages of data from the memory array 700. I/O circuitry 760 is included for bi-directional data communication over the I/O connections 762 with the host 710. Write circuitry 755 is included to write data to the memory array 700.

The controller 770 can control decoding of signals provided by control connections 772 from the host 710. These signals can include chip signals, write enable signals, and address latch signals that are used to control the operations on the memory array 700, including data sensing, data write, and data erase operations, as described herein. In a number of embodiments, the controller 770 is responsible for executing instructions from the host 710 to perform the operations according to embodiments of the present disclosure. The controller 770 can be a state machine, a sequencer, or some other type of controller. It will be appreciated by those skilled in the art that additional circuitry and control signals can be provided, and that the memory device detail of FIG. 7 has been reduced to facilitate ease of illustration.

CONCLUSION

The present disclosure includes apparatuses and methods for sensing memory cells. For example, sensing memory cells can include determining a data state of a first memory cell coupled to a first data line in response to a request to sense a data state of a second memory cell coupled to a second data line adjacent the first data line, applying a reference voltage to the first data line, floating the second data line while adjusting a voltage of the first data line from the reference voltage to an adjusted voltage associated with the determined data state of the first memory cell, determining an effect on the second data line due, at least in part, to the adjusting the voltage of the first data line, and sensing the data state of the second memory cell by applying a particular sensing voltage to a selected access line to which the first memory cell and the second memory cell are coupled, the particular sensing voltage based, at least partially, on the determined effect on the second data line.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory, comprising:
   determining a data state of a first memory cell coupled to a first data line in response to a request to sense a data state of a second memory cell coupled to a second data line adjacent the first data line;
   applying a reference voltage to the first data line;
   floating the second data line while adjusting a voltage of the first data line from the reference voltage to an adjusted voltage associated with the determined data state of the first memory cell;
   determining an effect on the second data line due, at least in part, to the adjusting the voltage of the first data line; and
   sensing the data state of the second memory cell by applying a particular sensing voltage to a selected access line to which the first memory cell and the second memory cell are coupled, the particular sensing voltage based, at least partially, on the determined effect on the second data line.

2. The method of claim 1, wherein applying a reference voltage to the first data line further includes applying the reference voltage to the second data line.

3. The method of claim 1, further comprising, while floating the first data line, determining the effect on the second data line due, at least in part, to the adjusting the voltage of the first data line.

4. The method of claim 1, wherein determining the effect on the second data line includes sensing whether a voltage on the second data line is different than the reference voltage.

5. The method of claim 1, wherein determining the effect on the second data line includes sensing whether a voltage on the second data line is above or below at least a first voltage threshold level.

6. The method of claim 1, wherein the method includes programming the first and the second memory cell in accordance with a shielded data line technique prior to receiving the request to sense the data state of the second memory cell.

7. The method of claim 1, wherein floating the second data line while adjusting a voltage of the first data line to the adjusted voltage associated with the determined data state of the first memory cell changes a voltage of the second data line due, at least partially, to capacitive coupling between the first and the second data line.

8. The method of claim 1, including:
   determining a data state of a third memory cell coupled to a third data line in response to the request to sense the data state of the second memory cell, the third data line is adjacent to the second data line;
   while the second data line is floating, adjusting a voltage of the third data line from the reference voltage to an adjusted voltage associated with the data state of the third memory cell;
   while floating the first data line and the third data line, determining an effect on the second data line due, at least in part, to the adjusting the voltage of the first data line, the adjusting the voltage of the third data line, and a capacitive coupling between at least the first and the second data line and between at least the second and the third data line; and
   wherein sensing the data state of the second memory cell by applying the particular sensing voltage to the selected access line includes applying a particular sensing voltage to the selected access line that is based, at least partially, on the determined effect on the second data line due, at least in part, to the capacitive coupling between at least the first and the second data line and between at least the second and the third data line.

9. The method of claim 1, wherein the first and the second memory cell are multilevel memory cells (MLCs).

10. A method for operating a memory, comprising:
    determining data stored by a first memory cell coupled to a first data line and a second memory cell coupled to a third data line in response to a request to sense data stored by a target memory cell coupled to a second data line adjacent the first data line and the third data line; and
    sensing the data stored by the target memory cell using a sensing voltage applied to a selected access line to which the first memory cell, the second memory cell, and the target memory cell are coupled, the sensing voltage based, at least partially, on the data stored by the first memory cell and the second memory cell and determined by:
       floating the second data line while adjusting voltages of the first data line and the third data line to adjusted voltages associated with the data stored by the respective first memory cell and second memory cell; and
       determining an effect on the second data line due, at least in part, to the adjusted voltages and a capacitive coupling between at least the first and the second data line and between the second and the third data line.

11. The method of claim 10, further comprising floating the first and third data lines while determining the effect on the second data line due, at least in part, to the adjusted voltages and the capacitive coupling between at least the first and the second data line and between the second and the third data line.

12. A method for operating a memory, comprising:
    determining data states of a first subset of memory cells in response to a request to sense data states of a second subset of memory cells;

floating the data lines to which the second subset of memory cells are coupled while adjusting voltages of the data lines to which the first subset of memory cells are coupled from a reference voltage to adjusted voltages associated with the determined data state of each of the respective memory cells of the first subset;

while floating the data lines coupled to the first subset of memory cells, determining an effect on the data lines to which the second subset of memory cells are coupled due, at least in part, to the adjusting the voltages of the data lines to which the first subset of memory cells are coupled; and sensing the data states of a number of the second subset of memory cells by applying a particular sensing voltage to a selected access line to which the first subset and the second subset of memory cells are coupled, the particular sensing voltage based, at least partially, on the determined effect on the data lines to which the number of the second subset of memory cells are coupled.

13. The method of claim 12, wherein the number of the second subset of memory cells comprises a first number of the second subset, and wherein the method includes sensing the data states of a second number of the second subset of memory cells by applying a different particular sensing voltage to the selected access line, the different particular sensing voltage based, at least partially, on the determined effect on the data lines to which the second number of the second subset of memory cells are coupled.

14. The method of claim 13, wherein the method includes sensing the data states of a third number of the second subset of memory cells by applying an additional different particular sensing voltage to the selected access line, the additional different particular sensing voltage based, at least partially, on the determined effect on the data lines to which the third number of the second subset of memory cells are coupled.

15. The method of claim 12, wherein determining the effect on the data lines to which the second subset of memory cells are coupled due, at least in part, to the adjusting the voltage of the data lines to which the first subset of memory cells are coupled includes determining whether at least one of the memory cells coupled to data lines directly adjacent the data lines to which the second subset of memory cells are coupled are programmed to a particular data state.

16. The method of claim 15, wherein the particular data state is an erased data state.

17. The method of claim 15, wherein the particular data state is a non-erased data state.

18. A memory apparatus, comprising:
an array of memory cells including a first subset of data lines and a second subset of data lines, wherein each data line of the first subset is adjacent to, and shares a common data line control component with, a data line of the second subset; and
a controller coupled to the array and configured to control a method that includes:
  determining data states of memory cells coupled to a selected access line and to the first subset in response to a request to sense data states of memory cells coupled to the selected access line and to the second subset;
  floating the second subset while adjusting voltages on data lines of the first subset to adjusted voltages associated with respective determined data states of the memory cells coupled to the first subset;
  determining an effect on the data lines of the second subset due, at least in part, to the adjusting the voltages on the data lines of the first subset to the adjusted voltages;
  responsive to the determined effect on the data lines of the second subset, determining a sensing voltage to be applied to the selected access line to sense the data states of the memory cells coupled to the selected access line and to the data lines of the second subset.

19. The apparatus of claim 18, wherein the controller is configured to control adjusting voltages on data lines of the first subset from a reference voltage applied to the first and to the second subset to the adjusted voltages.

20. The apparatus of claim 18, wherein the adjusted voltages associated with respective determined data states of the memory cells coupled to the first subset corresponds to either an erased data state or to a non-erased data state of the memory cells.

21. The apparatus of claim 18, wherein the controller is configured to control determining the effect on the respective data lines of the second subset by controlling performance of a number of sensing operations on the respective data lines of the second subset while floating the data lines of the first subset.

22. The apparatus of claim 21, wherein the controller is configured to control performance of the number of sensing operations by controlling performance of a first sensing operation to determine if a voltage on the respective data lines of the second subset has changed from the reference voltage to at least a first voltage threshold level.

23. The apparatus of claim 22, wherein the controller is configured to control performance of the number of sensing operations by controlling performance of a second sensing operation to determine if the voltage on the respective data lines of the second subset has changed from the reference voltage to at least a second voltage threshold level.

24. The apparatus of claim 22, wherein those data lines of the second subset determined to have a voltage less than the first voltage threshold level responsive to the first sensing operation conduct current responsive to the first sensing operation, and wherein the controller is configured to control performance of a clean up operation to adjust a voltage on those data lines of the second subset determined to have a voltage less than the first voltage threshold level subsequent to the first sensing operation.

25. The apparatus of claim 22, wherein those data lines of the second subset determined to have a voltage greater than the first voltage threshold level responsive to the first sensing operation conduct current responsive to the first sensing operation, and wherein the controller is configured to control performance of a clean up operation to adjust a voltage on those data lines of the second subset determined to have a voltage greater than the first voltage threshold level subsequent to the first sensing operation.

26. The apparatus of claim 23, wherein the controller is configured to control performing the second sensing operation on only those data lines of the second subset determined to have a voltage less than the first voltage threshold level.

27. The apparatus of claim 23, wherein the controller is configured to control performing the second sensing operation on only those data lines of the second subset determined to have a voltage greater than the first voltage threshold level.

28. The apparatus of claim 23, wherein the controller is configured to control:
applying a first sensing voltage to the selected access line to sense the data states of those memory cells coupled to the selected access line and to respective data lines of the second subset having a voltage determined not to have changed from the reference voltage to at least the first voltage threshold level responsive to the first sensing operation;

applying a second sensing voltage to the selected access line to sense the data states of those memory cells coupled to the selected access line and to respective data lines of the second subset having a voltage determined to have changed from the reference voltage to at least the first voltage threshold level responsive to the first sensing operation; and applying a third sensing voltage to the selected access line to sense the data states of those memory cells coupled to the selected access line and to respective data lines of the second subset having a voltage determined to have changed from the reference voltage to at least the second voltage threshold level responsive to the second sensing operation.

29. The apparatus of claim 28, wherein the first sensing voltage is an unadjusted sensing voltage, the second sensing voltage is a first adjusted sensing voltage, and the third sensing voltage is a second adjusted sensing voltage.

30. The apparatus of claim 18, wherein the controller is configured to control floating the data lines of the first subset while determining the effect on the respective data lines of the second subset, and wherein the effect on the respective data lines of the second subset is due, at least partially, to capacitive coupling associated with adjusting the voltage on the respective data lines of the first subset from the reference voltage to the adjusted voltage.

31. The apparatus of claim 18, wherein the array of memory cells is an array of multilevel memory cells (MLCs).

32. The apparatus of claim 18, wherein the controller is configured to control programming of the memory cells coupled to the selected access line and to the first subset of data lines to final data states, and to control programming the memory cells coupled to the selected access line and to the second subset of data lines to final data states, prior to controlling determining data states of memory cells coupled to the selected access line and to the first subset in response to the request to sense data states of memory cells coupled to the selected access line and to the second subset.

33. A memory apparatus, comprising:
an array of memory cells including a first subset of data lines and a second subset of data lines, wherein each respective data line of the first subset is adjacent to, and shares a common data line control component with, a respective data line of the second subset;

circuitry coupled to the array and configured to:
determine a data state of a memory cell coupled to a selected access line and to a data line of the first subset in response to a request to sense a data state of a target memory cell coupled to the selected access line and to a data line of the second subset;

determine a programmed status of the memory cell coupled to the data line of the first subset by performing a sensing operation on the data line of the second subset; and determine a particular sensing voltage to be applied to the selected access line to sense the data state of the target cell based, at least partially, on the determined programmed status of the memory cell coupled to the data line of the first subset.

34. The memory apparatus of claim 33, wherein the memory cell coupled to the data line of the first subset comprises a first memory cell coupled to a first data line of the first subset, and wherein the circuitry coupled to the array is configured to determine a data state of a second memory cell coupled to the selected access line and to a second data line of the first subset in response to the request to sense the data state of the target memory cell.

35. The memory apparatus of claim 34, wherein the circuitry coupled to the array is configured to:
determine a programmed status of the second memory cell by performing the sensing operation on the data line of the second subset; and determine the particular sensing voltage to be applied to the selected access line to sense the data state of the target cell based, at least partially, on the determined programmed status of the first and the second memory cell.

36. The memory apparatus of claim 35, wherein the circuitry coupled to the array is configured to float the first data line and the second data line while performing the sensing operation on the data line of the second subset.

37. The memory apparatus of claim 33, wherein the memory cell coupled to the data line of the first subset comprises a first memory cell coupled to a first data line of the first subset, and wherein a second data line of the first subset shares a data line control component with the data line of the second subset, and wherein the common data line control component is configured to hold the second data line of the first subset at a reference voltage while performing the sensing operation on the data line of the second subset.

* * * * *

UNITED STATES PATENT AND TRADEMARK OFFICE
CERTIFICATE OF CORRECTION

Page 1 of 1

PATENT NO.        : 8,891,297 B2
APPLICATION NO.   : 13/286301
DATED             : November 18, 2014
INVENTOR(S)       : Kalyan C. Kavalipurapu et al.

It is certified that error appears in the above-identified patent and that said Letters Patent is hereby corrected as shown below:

On the title page, item (74), in column 2, in "Attorney, Agent, or Firm", line 1, delete "Brook," and insert -- Brooks, --, therefor.

Signed and Sealed this
Twenty-fourth Day of February, 2015

Michelle K. Lee
*Deputy Director of the United States Patent and Trademark Office*